(12) United States Patent
Maloney

(10) Patent No.: US 6,924,040 B2
(45) Date of Patent: Aug. 2, 2005

(54) THERMAL BARRIER COATING SYSTEMS AND MATERIALS

(75) Inventor: Michael J. Maloney, Marlborough, CT (US)

(73) Assignee: United Technologies Corporation, Hartford, CT (US)

( * ) Notice: Subject to any disclaimer, the term of this patent is extended or adjusted under 35 U.S.C. 154(b) by 59 days.

(21) Appl. No.: 10/037,000

(22) Filed: Dec. 21, 2001

(65) Prior Publication Data

US 2003/0049470 A1 Mar. 13, 2003

Related U.S. Application Data

(60) Continuation-in-part of application No. 09/746,457, filed on Dec. 21, 2000, now abandoned, which is a continuation of application No. 09/436,212, filed on Nov. 8, 1999, now Pat. No. 6,231,991, which is a division of application No. 08/764,419, filed on Dec. 12, 1996, now Pat. No. 6,117,560.

(51) Int. Cl.$^7$ .............................. B32B 9/00; B32B 15/04
(52) U.S. Cl. .................. 428/472; 416/241 B; 428/457; 428/469; 428/697; 428/699; 428/701; 428/702; 428/304.4; 428/312.2; 428/312.8
(58) Field of Search ................................ 428/457, 469, 428/472, 701, 702, 659, 657, 304.4, 312.2, 312.8; 416/241 B

(56) References Cited

U.S. PATENT DOCUMENTS

| | | | |
|---|---|---|---|
| 3,634,113 A | * | 1/1972 | Fehrenbacher |
| 4,005,989 A | | 2/1977 | Preston ........................ 29/194 |
| 4,180,484 A | * | 12/1979 | Marchant |
| 4,209,348 A | | 6/1980 | Duhl et al. .................... 148/3 |
| 4,321,310 A | * | 3/1982 | Ulion et al. |
| 4,321,311 A | | 3/1982 | Strangman ................. 428/623 |
| 4,507,394 A | * | 3/1985 | Mase et al. |
| RE32,121 E | | 4/1986 | Gupta et al. ................. 428/656 |
| 4,585,481 A | | 4/1986 | Gupta et al. ............. 106/14.05 |
| 4,880,614 A | * | 11/1989 | Strangman et al. |
| 4,895,201 A | | 1/1990 | DeCrescente et al. ...... 164/56.1 |
| 4,897,315 A | | 1/1990 | Gupta ........................ 428/552 |
| 4,927,714 A | * | 5/1990 | Priceman |
| 4,936,745 A | | 6/1990 | Vine et al. ............... 415/173.4 |
| 5,008,221 A | * | 4/1991 | Ketcham |
| 5,073,433 A | | 12/1991 | Taylor ........................ 428/134 |
| 5,262,245 A | | 11/1993 | Ulion et al. ................. 428/469 |
| 5,346,563 A | | 9/1994 | Allen et al. ................. 148/675 |
| 5,514,482 A | | 5/1996 | Strangman .................. 428/623 |
| 5,538,796 A | | 7/1996 | Schaffer et al. ............. 428/469 |
| 5,687,679 A | | 11/1997 | Mullin et al. ............. 123/41.79 |
| 5,705,231 A | | 1/1998 | Nissley et al. .............. 427/453 |
| 5,780,157 A | * | 7/1998 | Tuffias et al. |
| 6,117,200 A | | 9/2000 | Berg et al. ..................... 55/287 |
| 6,117,560 A | | 9/2000 | Maloney ..................... 428/472 |
| 6,177,200 B1 | | 1/2001 | Maloney ..................... 428/472 |
| 6,183,884 B1 | * | 2/2001 | Rickerby |
| 6,187,453 B1 | * | 2/2001 | Maloney |
| 6,500,283 B1 | * | 12/2002 | Schaeffer et al. |
| 6,582,834 B2 | * | 6/2003 | Nagaraj et al. |

FOREIGN PATENT DOCUMENTS

| EP | 360 773 | * | 3/1990 |
|---|---|---|---|
| WO | 82/03876 | * | 11/1982 |

* cited by examiner

*Primary Examiner*—Archene Turner
(74) *Attorney, Agent, or Firm*—F. Tyler Morrison

(57) ABSTRACT

A ceramic material has particular utility as a thermal insulating or thermal barrier coating on metallic substrates. The ceramic material includes gadolinia and hafnia, preferably forming gadolinia-hafnia. This material exhibits chemical stability, thermal stability and thermal insulating properties superior to those of currently used thermal barrier ceramics, and also provides resistance to sintering and erosion comparable to currently used ceramics. A preferred material has between about 3–70 mol. % hafnia, balance hafnia.

18 Claims, 5 Drawing Sheets

THERMAL BARRIER COATING SYSTEMS AND MATERIALS

CROSS REFERENCE TO RELATED CASES

This is a continuation-in-part of co-pending U.S. application Ser. No. 09/746,457 filed on Dec. 21, 2000 now abandoned entitled "Thermal Barrier Coating Systems and Materials", which is a continuation of Ser. No. 09/436,212 filed Nov. 8, 1999, now U.S. Pat. No. 6,231,991 entitled "Thermal Barrier Coating Systems and Materials", which is a divisional of Ser. No. 08/764,419, filed Dec. 12, 1996 now U.S. Pat. No. 6,117,560 entitled "Thermal Barrier Coating Systems and Materials".

FIELD OF THE INVENTION

This invention relates to ceramic materials for thermal barrier coatings, to thermal barrier coatings made of such materials, and to metallic parts having such thermal barrier coatings. The thermal barrier coatings have particular utility in gas turbines and other applications involving high operating temperatures. The preferred ceramic material is composed of gadolinia and hafnia.

BACKGROUND OF THE INVENTION

Gas turbine engines are well developed mechanisms for converting chemical potential energy, in the form of fuel, to thermal energy and then to mechanical energy for use in propelling aircraft, generating electric power, pumping fluids etc. At this time, the major available avenue for improved efficiency of gas turbine engines appears to be the use of higher operating temperatures. However, the metallic materials used in gas turbine engines are currently very near the upper limits of their thermal stability. In the hottest portion of modern gas turbine engines, metallic materials are used at gas temperatures above their melting points. They survive because they are air cooled. But providing air cooling reduces efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Such coatings are invariably based on ceramic. Mullite, alumina, etc. have been proposed, but zirconia is the current material of choice. Zirconia must be modified with a stabilizer to prevent the formation of the monoclinic phase, and typical stabilizers include yttria, calcia, ceria and magnesia. Other stabilizers include gadolinia, e.g., commonly owned U.S. Pat. No. 6,117,200 to Maloney entitled "Thermal Barrier Coatings and Materials", which is expressly incorporated by reference herein.

Generally speaking, metallic materials have coefficients of thermal expansion which exceed those of ceramic materials. Consequently, one of the problems that must be addressed in the development of successful thermal barrier coatings is to match the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Thermal barrier coatings have been deposited by several techniques including thermal spraying (plasma, flame and HVOF), sputtering and electron beam physical vapor deposition (EBPVD). Thermal spray techniques are typically employed for non-rotating components, and for components that are not exposed to the highest temperature applications encountered in gas turbines. Thermal spray coatings tend to have lower thermal conductivities than their EBPVD counterparts due to the nature of the coating structure, e.g., a series of built up splats formed during thermal spray application process. Electron beam physical vapor deposition is currently a preferred technique for more demanding applications because it produces a unique coating structure. Electron beam physical vapor deposited ceramic materials, when applied according to certain parameters, have a columnar grain microstructure consisting of small columns separated by gaps which extend into the coating. These gaps allow substantial substrate expansion without coating cracking and/or spalling over a wide range of temperatures. See, e.g., commonly owned U.S. Pat. No. 4,321,311. According to U.S. Pat. No. 5,073,433 and commonly-owned U.S. Pat. No. 5,705,231, a similar structure (comprising segmentation cracks) although on a larger scale, can be obtained by thermal spray techniques.

Despite the success with the current use of electron beam physical vapor deposited zirconia base coatings, there is a continuing desire for improved coatings which exhibit superior thermal insulation capabilities, especially those show improvement even when normalized for coating density. Weight is always a critical factor when designing gas turbine engines, particularly rotating parts. Ceramic thermal barrier coatings are not load supporting materials, and consequently they add weight without increasing strength. There is a strong desire for a ceramic thermal barrier material which adds the minimum weight while providing the maximum thermal insulation capability. In addition, there are obviously the normal desires for long life, stability, economy etc.

Although this coating was developed for application in gas turbines, the invention also has utility in other applications where high temperatures are encountered, such as furnaces and internal combustion engines.

SUMMARY OF THE INVENTION

Figure 1:
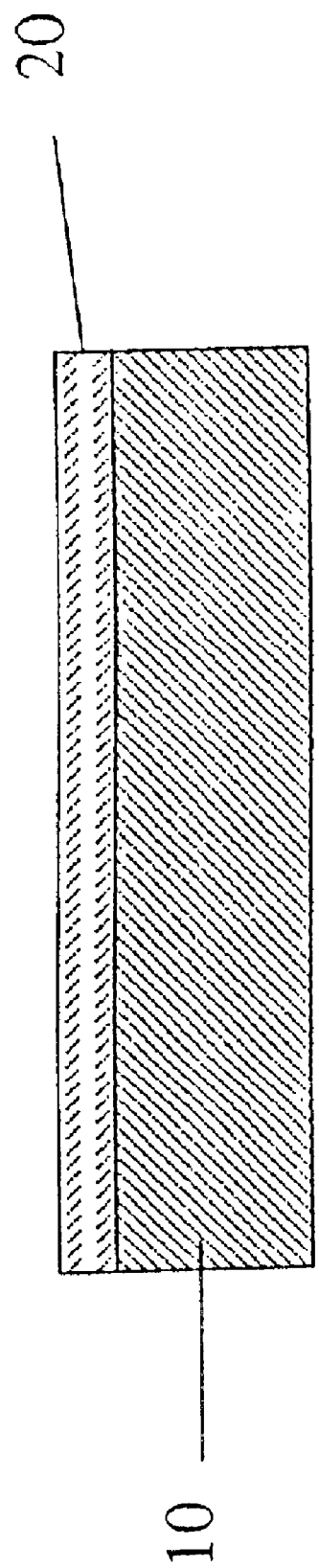
FIG. 1 is a partial schematic view of an article coated according to the present invention.

The present invention is directed to thermal barrier coatings based on hafnia rather than conventional coatings which are based on zirconia. Depending upon the coating constituent materials, the coatings may or may not have a conventional fluorite or pyrochlore or other crystal structure. Preferably these coatings also comprise rare earth oxides, such as gadolinia, lanthana, ceria, praseodia, neodymia, promethia, samaria, europia, terbia, dysprosia, holmia, erbia, thulia, ytterbia and lutetia, and also including yttria, calcia and magnesia, and preferably at least gadolinia.

We have found that, on a density adjusted basis, the ceramic hafnate TBCs which we have investigated have thermal insulating properties which exceed those of the more commonly used zirconia-based thermal barrier materials, despite the fact that on a density adjusted basis gadolinia hafnia is about 1.5×heavier than traditional yttria zirconia ceramic materials. Additionally, many of these compositions have a phase relationship in which the crystal structure is phase stable up to the melting point—or at least to temperatures which exceed current operating temperatures of gas turbines.

The invention coating materials and coatings will usually be used to protect a superalloy substrate from excess temperatures. Superalloys are metals, usually based on iron, nickel or cobalt and containing chromium and aluminum and usually including titanium and refractory metals, and having useful properties above 1200° F. (650° C.). Other substrates, including steels, copper alloys and titanium alloys may be protected. Articles may be cast in known manners to form equiaxed, columnar grain or single crystal structures. Table I describes exemplary substrate materials.

TABLE I (wt % - Exemplary Nominal Superalloy Compositions)

|  | Cr | Co | W | Cb | Ti | Al | B | Hf | C | Ni | Ta | Mo | Zr | Re |
|---|---|---|---|---|---|---|---|---|---|---|---|---|---|---|
| PWA1422 | 9 | 10 | 12 | 1 | 2 | 5 | 0.015 | 1.6 | .14 | Bal | — | — | — | — |
| PWA1426 | 6.4 | 12.6 | 6.4 | — | — | 5.9 | 0.012 | 1.5 | — | Bal | 3.0 | 1.7 | .08 | .3 |
| PWA1480 | 10 | 5 | 4 | — | 1.5 | 5 | — | — | — | Bal | 12 | — | — | — |
| PWA1484 | 5 | 10 | 5.9 | — | — | 5.6 | — | 0.1 | — | Bal | 8.7 | 1.9 | — | 3.0 |
| PWA1487 | 5 | 10 | 5.9 | — | — | 5.6 | — | .35 | — | Bal | 8.4 | 1.9 | — | 3.0 |
| IN 792 | 12 | 9 | 3.8 | — | 4.1 | 3.5 | 0.015 | 0.5 | .12 | Bal | 3.9 | 1.9 | .12 | — |

As in other ceramic thermal barrier coatings, adherence of the ceramic to the alloy substrate is critical.

It is known from prior, zirconia-based thermal barrier coatings that a metallic bond coat (sometimes described as an overlay coating) such as an MCrAlY is a superior bond coat for ceramic coatings. It is also known that aluminide coatings are useful bond coats, though generally not as durable as MCrAlY bond coats. The common feature of overlay coatings and aluminide coatings is that they both form adherent alumina surface films or scales.

A broad composition range for MCrAlY materials, in wt. %, is 10–25% Cr, 5–15 Al, 0.1–1.0 Y balance selected from Fe, Ni, and Co and mixtures of Ni and Co. See, e.g., commonly owned U.S. Pat. Nos. 4,585,481 and Re. 32,121 both of which are expressly incorporated by reference herein. Additions of up to 5% each of Hf, Ta or Re, up to 1% of Si and up to 3% each of Os, Pt, Pd, or Rh may also be made. Table II describes exemplary MCrAlYs that can be applied by thermal spray processes, by EBPVD processes, by electroplating and other suitable manners.

TABLE II (wt % - Exemplary MCrAlY Compositions)

|  | Ni | Co | Cr | Al | Y | Hf | Si |
|---|---|---|---|---|---|---|---|
| NiCrAlY | Bal | — | 19.5 | 12.5 | .45 | — | — |
| CoCrAlY | — | Bal | 18 | 11 | .45 | — | — |
| NiCoCrAlY | Bal | 23 | 18 | 12.5 | .3 | — | — |
| NiCoCrAlY | Bal | 22 | 17 | 12.5 | .6 | .25 | .4 |

An alternate bond coat is a diffusion aluminide formed by diffusing aluminum into the substrate surface. Diffusion aluminides are well known and may be applied using a mixture (termed a pack) containing an aluminum source, such as an aluminum alloy or compound, an activator (usually a halide compound such as NaF) and an inert material such as alumina. The part to be coated is buried in the pack and heated to 1500–2000° F. while a carrier gas, such as hydrogen, is flowed through the pack. Out of pack processes, during which the part is not buried in the pack, are also known. The incorporation of precious metals such as Pt, Rh, Pd and Os into aluminide coatings is known. See, e.g., U.S. Pat. No. 5,514,482 for a description of aluminide coating processes.

Combinations of overlay and aluminide coatings are also possible. See, commonly owned U.S. Pat. No. 4,897,315 for a description of a system having an inner MCrAlY overlay coating and an outer aluminide coating. See, commonly owned U.S. Pat. No. 4,005,989 for a description of the reverse combination, an inner aluminide coating and an outer overlay coating.

The common feature of these bond coats and bond coat combinations is that they form an adherent layer of alumina on their outer surface. The invention thermal barrier coating has limited solubility in alumina, but bonds firmly to the alumina.

In certain cases, superalloys may form sufficiently perfect and adherent alumina layers to which the ceramics may adhere without a separate bond coat. See, commonly owned U.S. Pat. Nos. 4,209,348, 4,719,080, 4,895,201, 5,034,284, 5,262,245 and 5,346,563; see also 5,538,796.

To date all successful applications of ceramic coatings to superalloy have included an oxide layer (usually alumina, occasionally chromia, rarely silica) between the bond coat (or substrate) and the ceramic coating.

DESCRIPTION OF THE PREFERRED EMBODIMENTS

The low thermal conductivity of hafnia based coatings can be rationalized by consideration of crystallographic and chemical effects on thermal conductivity. The thermal conductivity of dielectric solids at elevated temperature is determined by phonon scattering, by crystal imperfections and by other phonons. It has been experimentally established that as the difference in atomic mass between constituents in a compound increases, the thermal conductivity of that compound tends to decrease. It should be noted that, for thermal barrier applications and particularly for rotating components, the benefits obtained from the reduction in thermal conductivity resulting from the use of high atomic mass elements must outweigh the debit incurred from higher density.

Reduction in thermal conductivity has also been associated with increasing complexity of crystallographic structure. For example, pyrochlore structures are generally associated with lower thermal conductivities, see, e.g., commonly owned U.S. Pat. Nos. 6,117,560 and 6,177,200, which are hereby expressly incorporated by reference herein. In the case of gadolinia hafnia, the pyrochlore composition includes about 28–40 mol. % gadolinia.

Thermal barrier coatings are typically applied by thermal spray processes, such as plasma spray, in air (APS) or in low pressure (LPPS) by high velocity oxygen fuel processes (HVOF) or by detonation guns (D Gun). Electron beam physical vapor deposition (EBPVD) and sputtering are other techniques. Electron beam physical vapor deposition is a favored process for the more demanding applications, e.g., turbine blades in gas turbines. Depending upon the application and circumstances, each process has particular advantages. All of these processes can be readily used to apply hafnia based thermal barrier coatings, including gadolinia hafnia. As previously discussed, the EBPVD process offers advantages, since it develops a structure suited for extreme temperature applications and is therefore be most suitable for coating hot section turbine components. Thermal spray processing offers advantages in coating large components of complex shape and would be most suitable in coating components such as combustors.

Figure 4:
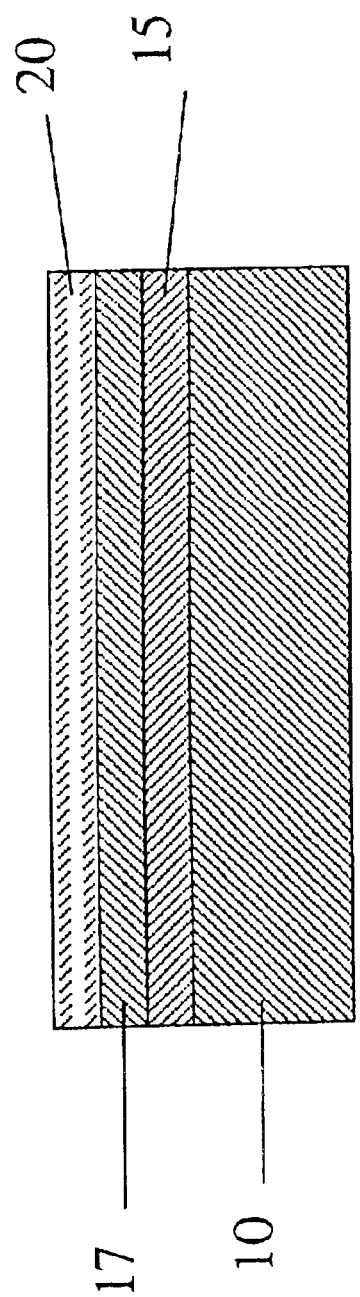
FIG. 4 is another embodiment of the present invention, including a ceramic bond coat.
Figure 5:
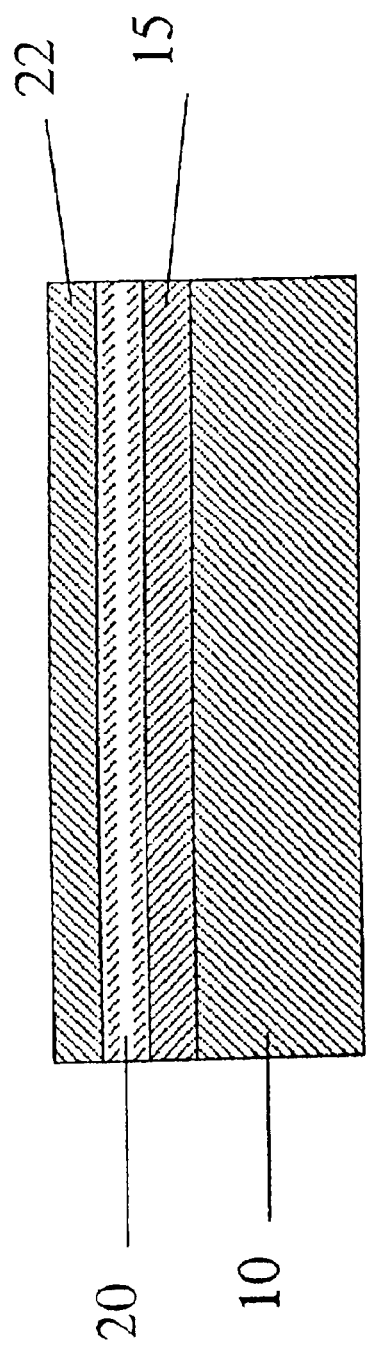
FIG. 5 is still another embodiment including an overcoat.

FIGS. 1, 4 and 5 illustrate variants of the thermal barrier coatings in accordance with the present invention. FIG. 1 depicts a coated article which comprises a superalloy substrate 10 having a ceramic TBC 20 on its outer surface. In gas turbine applications, the backside of the superalloy substrate 10 will be cooled by cooling air (not shown) and the outside surface of the TBC will be exposed to elevated temperatures. There may also be holes between the outer surface and the backside permitting cooling air to flow from the backside to the outer surface. Angled and shaped cooling holes in combination with flowing hot gases on the outer surface can produce film cooling in which a layer of cool air separates the outside surface from the hot gases to further reduce heat flow. Heat will flow from the outside surface to the cooled surface and the quantity of the heat flow will be substantially reduced by the layer 20. As previously mentioned, the TBC may be applied by various methods and the macrostructure of the ceramic layer will be largely a function of the deposition process. The most basic invention embodiment is a ceramic layer composed of hafnia which is adhered to a substrate which reduces heat flow in the presence of a thermal gradient.

FIG. 4 illustrates an embodiment of the invention which employs a metallic bond coat 15 between the substrate 10 and the hafnia based ceramic layer 20. The bond coat 15 can improve adherence and provides oxidation protection for the substrate. In addition the example of FIG. 5 also illustrates the option of a ceramic bond coat 17 between the bond coat 15 and hafnia ceramic 20. In some cases, such a ceramic bond coat, e.g., stabilized zirconia such as 7YSZ may provide good adherence to the metallic bond coat/oxide scale, while the overlying ceramic bonds well to the ceramic bond coat, although we believe that such a ceramic bond coat is not needed in the case of gadolinia hafnia.

In a further embodiment illustrated in FIG. 5, another layer 22, whether metallic or ceramic or both, may be applied to the free surface of the thermal barrier coating. This added layer can be selected to reduce oxygen diffusion, to provide erosion and abrasion resistance, or to provide a desired thermal emissivity or reflectivity characteristic, or some combination of these characteristics.

Figure 2:
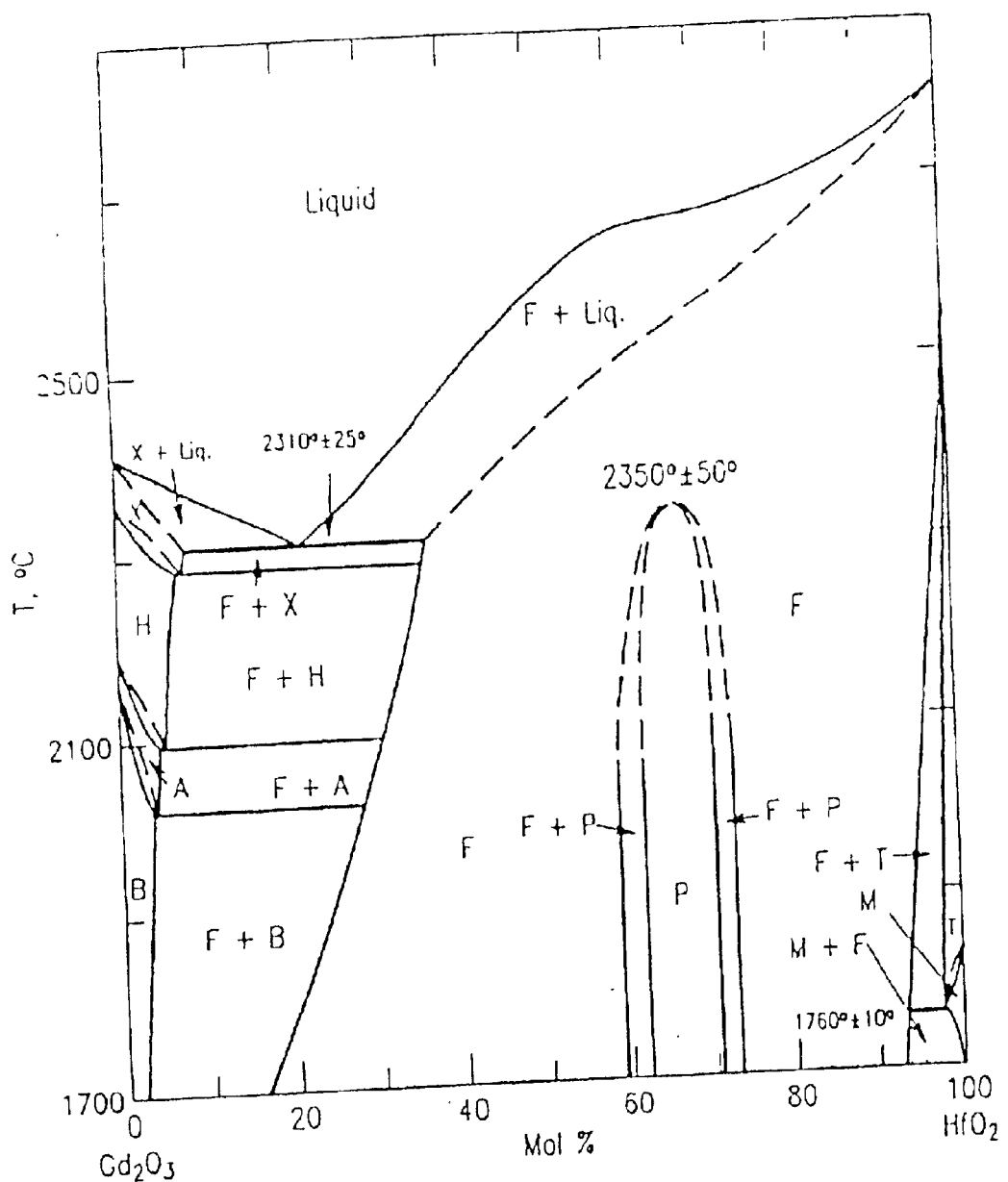
FIG. 2 shows the $HfO_2$-$Gd_2O_3$ phase diagram.

With reference to FIG. 2, one preferred composition is based on gadolinia and hafnia. While we believe that preferred compositions of the invention include hafnia with between roughly 3–70 mol. % gadolinia, I do not rule out use of other compositions. Additionally, the hafnia or gadolinia can be partially substituted with yttria, zirconia, other rare earth oxides such as lanthana, ceria, praseodymia, neodymia, promethia, samaria, europia, terbia, dysprosia, holmia, erbia, thulia, ytterbia and lutetia, and also yttria, calcia and magnesia, up to about 20–25 mol. % and preferably only up to about 15 mol. %.

Figure 3:
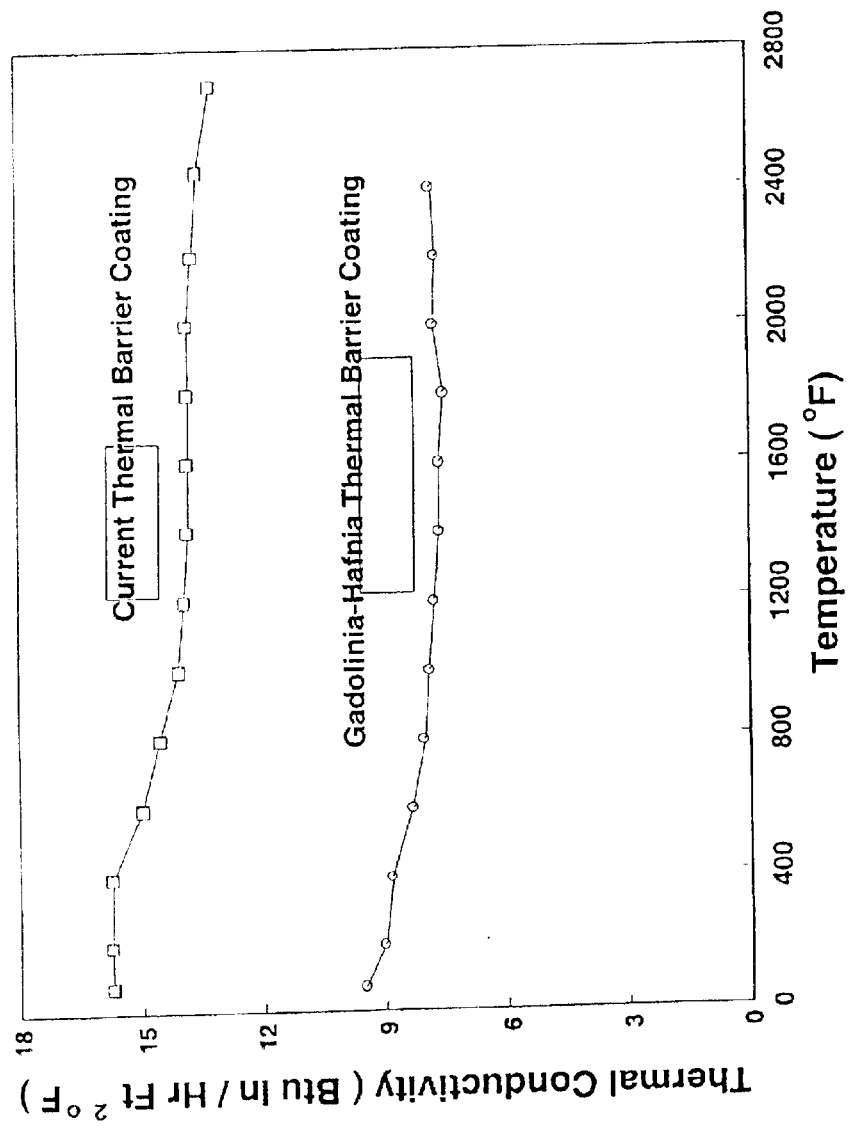
FIG. 3 shows the thermal conductivity of gadolinia-hafnia samples having a cubic structure, and is compared to a sample of yttria stabilized zirconia (YSZ).

FIG. 3 shows calculated thermal conductivity values for gadolinia-hafnia compared to the thermal conductivity of yttria-zirconia ("Current TBC") as a function of temperature. To illustrate the benefit, the reduction in thermal conductivity allows the coating thickness to be reduced by a corresponding amount while maintaining the same degree of thermal insulation. Decreasing the coating mass for use with a typical turbine blade will lower the blade pull at the blade root significantly at typical operating conditions, which results in a significant increase in blade life and permits a reduction in mass of the disk to which the blades are attached, the shafts to which the disks are attached, etc. If the thermal barrier coating were held at the same thickness, and the cooling air flow held constant, the substrate temperature would be reduced giving increased substrate creep life. Keeping the coating thickness constant and reducing the cooling airflow would increase engine efficiency. Combinations of these benefits, e.g., (slightly) reduced coating mass and (slightly) reduced cooling air, are also possible.

The mass of gadolinia hafnia is about 45% greater than compared to 7YSZ. Given the reduced thermal conductivity. Thus, on a density-adjusted basis, the thermal conductivity of gadolinia hafnia is roughly the same as 7YSZ.

As noted above, it has been experimentally established and accepted that as the difference in atomic mass between constituents in a compound increases, the thermal conductivity of that compound tends to decrease. It would therefore be expected that gadolinia hafnia oxide has a lower thermal conductivity than YSZ, given that there is a greater difference in atomic mass between Gd (about 157) and Hf (about 178) than between Y (about 89) and Zr (about 91).

The above embodiments of the present invention include the use of the coating as a single, generally homogeneous layer. However, the coating of the present invention can be employed in a system including multiple, discrete layers, for example as described in commonly owned U.S. Pat. No. 5,687,679, which is expressly incorporated herein by reference.

Again, with reference to FIG. 5, we believe that applying a thin layer of a ceramic such as YSZ onto the alumina layer prior to applying the TBC can in some cases be useful for ensuring an adequate adherent layer, or ceramic bond coat, for the subsequently-applied ceramic hafnate TBC layer. Such a ceramic bond coat is not believed to be necessary in connection with the present invention, e.g. when composed of gadolinia and hafnia, but can be used.

While the present invention developed for use primarily as a thermal barrier coating, it may also be desirable to deposit the material, with a desired degree of porosity, for use as a seal. See, e.g., commonly owned U.S. Pat. No. 4,936,745, which is expressly incorporated by reference herein. An example would be the incorporation of polymer material, e.g., polyester or Lucite spheres as are know in the art, into gadolinia hafnia oxide, with subsequent application by thermal spray and heat treatment to generate pores in the ceramic. In such a case, sufficient filler material is incorporated into the ceramic such that the as-deposited coating preferably has a porosity of between about 5–35 vol. % or other desired porosity.

Although this invention has been shown and described with respect to detailed embodiments thereof, it will be understood by those skilled in the art that various changes, omissions and additions in form and detail thereof may be made without departing from the spirit and scope of the claimed invention.

I claim:

1. A metallic article comprising a metallic substrate selected from the group consisting of steels, superalloys, titanium alloys and copper alloys and having a thermally-insulating ceramic coating on its surface wherein the ceramic coating is composed primarily of 3–70 mol. % gadolinia, balance hafnia.

2. An article as in claim 1, wherein the coated article is adopted to be used in environments where the free surface of the ceramic coating will be heated and the free surface of the substrate will be cooled, whereby the ceramic coating will reduce heat flow.

3. An article as in claim 1, wherein the ceramic coating has a columnar microstructure.

4. A metallic article as in claim 1, wherein the metallic article has an oxide scale on its outer surface, the oxide scale comprising alumina, and wherein the ceramic coating is bonded to the oxide scale.

5. An article as in claim 1, wherein the ceramic coating is composed of between about 28–40 mol. % gadolinia, balance hafnia.

6. An article as in claim 1, wherein the coating has a thermal sprayed structure characterized by built up splats.

7. An article as in claim 1, further comprising:
a ceramic bond coat between the ceramic coating and the metallic substrate.

8. An article as in claim 1, the ceramic coating further comprising up to about 25 mol. % of at least one of gadolinia, lanthana, ceria, praseodia, neodymia, promethia, samaria, europia, terbia, dysprosia, holmia, erbia, thulia, ytterbia and lutetia, calcia or magnesia.

9. An article as in claim 1, the ceramic coating having a porosity of between about 5–35 vol. %.

10. A metallic article comprising a superalloy substrate selected from the group consisting of steels, superalloys, titanium alloys and copper alloys and the substrate having an alumina forming coating on its surface and a thermally-insulating ceramic coating bonded to the alumina forming coating, wherein the ceramic coating is composed of gadolinia and hafnia.

11. An article as in claim 10, wherein the ceramic coating has a columnar microstructure.

12. An article as in claim 10, wherein the ceramic coating has a thermal spray structure characterized by built up splats.

13. An article as in claim 10, wherein the ceramic coating is composed of gadolinia hafnia oxide having between about 3–70 mol. % gadolinia, balance hafnia.

14. An article as in claim 10, wherein the alumina forming coating comprises an overlay coating or an aluminide coating.

15. An article as in claim 10, the ceramic coating having a porosity of between about 5–35 vol. %.

16. An article as in claim 1 forming a gas turbine component.

17. An article as in claim 10 forming a gas turbine engine component.

18. An article as in claim 10, the ceramic coating further comprising at least one of the following lanthana, ceria, praseodia, neodymia, promethia, samaria, europia, terbia, dysprosia, holmia, erbia, thulia, ytterbia and lutetia, yttria, calcia and magnesia.

* * * * *